(12) United States Patent
Cheng et al.

(10) Patent No.: US 9,214,462 B2
(45) Date of Patent: Dec. 15, 2015

(54) RECESSED SOURCE DRAIN CONTACT REGIONS INDEPENDENT OF DEVICE PITCH BY UNMERGED EPITAXY ON FIN PORTIONS

(71) Applicant: INTERNATIONAL BUSINESS MACHINES CORPORATION, Armonk, NY (US)

(72) Inventors: Kangguo Cheng, Schenectady, NY (US); Ali Khakifirooz, Los Altos, CA (US); Eric D. Marshall, White Plains, NY (US); Alexander Reznicek, Troy, NY (US); Benjamen N. Taber, Portland, OR (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/266,846

(22) Filed: May 1, 2014

(65) Prior Publication Data
US 2015/0318281 A1 Nov. 5, 2015

(51) Int. Cl.
H01L 29/78 (2006.01)
H01L 29/45 (2006.01)
H01L 27/088 (2006.01)
H01L 21/8234 (2006.01)
H01L 29/66 (2006.01)
H01L 21/285 (2006.01)

(52) U.S. Cl.
CPC ...... *H01L 27/0886* (2013.01); *H01L 21/28518* (2013.01); *H01L 21/823431* (2013.01); *H01L 21/823437* (2013.01); *H01L 21/823475* (2013.01); *H01L 29/456* (2013.01); *H01L 29/665* (2013.01)

(58) Field of Classification Search
USPC .......... 257/192, 347, 401; 438/283, 157, 197, 438/478
See application file for complete search history.

(56) References Cited

U.S. PATENT DOCUMENTS

| | | | |
|---|---|---|---|
| 7,692,254 B2 | 4/2010 | Anderson et al. | |
| 8,043,920 B2 | 10/2011 | Chan et al. | |
| 8,362,568 B2 | 1/2013 | Lin et al. | |
| 8,455,313 B1 | 6/2013 | Basker et al. | |
| 8,900,936 B2 * | 12/2014 | Kulkarni et al. | 438/157 |
| 2011/0084336 A1 * | 4/2011 | Luning et al. | 257/347 |
| 2011/0298058 A1 * | 12/2011 | Kawasaki et al. | 257/401 |
| 2012/0056264 A1 | 3/2012 | Anderson et al. | |
| 2012/0091538 A1 | 4/2012 | Lin et al. | |
| 2013/0069128 A1 | 3/2013 | Okano | |
| 2015/0129983 A1 * | 5/2015 | Yu et al. | 257/401 |
| 2015/0140756 A1 * | 5/2015 | Yu et al. | 438/275 |

* cited by examiner

*Primary Examiner* — Marc Armand
*Assistant Examiner* — Younes Boulghassoul
(74) *Attorney, Agent, or Firm* — Matthew C. Zehrer

(57) ABSTRACT

A semiconductor device fabrication process includes forming a plurality of fins upon a semiconductor substrate and forming a plurality of gate stacks upon the semiconductor substrate orthogonal to the plurality of fins, forming fin portions by recessing the plurality of fins and semiconductor substrate adjacent to the plurality of gate stacks, and forming uniform unmerged epitaxy upon the fin portions. A semiconductor device includes the plurality of fins, the plurality of gate stacks, a first semiconductor substrate recess between a first gate stack pair and a second semiconductor recess between a second gate stack pair, and unmerged epitaxy. The plurality of fins each include fin portions and the unmerged epitaxy including a first epitaxy pair contacting fin portions associated with the first gate stack pair and a second epitaxy pair contacting fin portions associated with the second gate stack pair.

18 Claims, 8 Drawing Sheets

US 9,214,462 B2

RECESSED SOURCE DRAIN CONTACT REGIONS INDEPENDENT OF DEVICE PITCH BY UNMERGED EPITAXY ON FIN PORTIONS

FIELD

Embodiments of invention generally relate to semiconductor devices, design structures for designing a semiconductor device, and semiconductor device fabrication methods. More particularly, embodiments relate to semiconductor structures with multiple gate pitches and recessed source drain region contacts.

BACKGROUND

There is difficulty in maintaining performance improvements in devices of deeply submicron generations. One general approach for improving performance is to try to increase carrier (electron and/or hole) mobilities. A promising avenue toward better carrier mobility is to apply tensile or compressive stress in the semiconductor channel regions. However, applying stress to non-planar, three dimensional (3D) FETs, such as a FinFET, or Tri-Gate device, may be more difficult. Stress liners commonly used for planar devices are not very efficient, partly because of the 3D nature of the device, and partly because of the shrinking of the device pitch as technology progresses. Smaller device pitch leads to thinner stress liners, and that results in less channel stress. One way to increase the stress coupling in e.g. FinFETs maybe to recess, namely etch down, the source/drain area of the fins or to epitaxially grow material from the fins within source/drain regions.

In some semiconductor devices, gate pairs may be separated by a narrow pitch and other gate pairs may be separated by a wider pitch. Currently, during epitaxy growth, it is difficult to manage the merging of epitaxial material grown from the fins within the source/drain regions separated by the wider pitch while also managing epitaxy overgrowth between fins separated by the narrow pitch. Further, epitaxy may grow at variable rates depending upon depending upon the location of the fin within a fin area of the structure. These epitaxy variations introduce subsequent problems when making and forming electrical contacts within these regions.

SUMMARY

Embodiments of invention generally relate to semiconductor devices, and more particularly to design structures, semiconductor devices, and fabrication of semiconductor devices.

In an embodiment of the present invention, a semiconductor device fabrication process includes forming a plurality of fins upon a semiconductor substrate and forming a plurality of gate stacks upon the semiconductor substrate orthogonal to the plurality of fins, forming fin portions by recessing the plurality of fins and semiconductor substrate adjacent to the plurality of gate stacks, and forming uniform unmerged epitaxy upon the fin portions.

In another embodiment of the present invention, a semiconductor device includes a plurality of fins formed upon a semiconductor substrate, a plurality of gate stacks formed upon the semiconductor substrate and upon and orthogonal to the plurality of fins, a first semiconductor substrate recess between a first gate stack pair and a second semiconductor recess between a second gate stack pair, and unmerged epitaxy. The plurality of fins each include fin portions and the unmerged epitaxy including a first epitaxy pair contacting fin portions associated with the first gate stack pair and a second epitaxy pair contacting fin portions associated with the second gate stack pair.

In another embodiment of the present invention, the semiconductor device is included in a design structure tangibly embodied in a machine readable medium for designing, manufacturing, or testing an integrated circuit.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, and more particularly to a 3D semiconductor structures utilizing a fin, such as a FinFET. A FinFET device may include a plurality of fins formed in a wafer and a gate covering a portion of the fins. The portion of the fins covered by the gate may serve as a channel region of the device. Portions of the fins may also extend out from under the gate and may serve as source and drain regions of the device. Semiconductor structures including FinFETs may be implemented with gate first or gate last FinFET fabrication process techniques. In gate first processes, metal layers over first structure areas (e.g. NMOS areas, etc.) and second structure areas (e.g. PMOS areas, etc.) are formed and patterned to form gate structures followed by typical CMOS processing such as forming of the source and drain, forming spacers and depositing of the interlevel dielectric. In a gate last process, a dummy gate structure is formed followed by typical CMOS processing including formation of the source and drain, formation of spacers and deposition of the interlevel dielectric. Thereafter, the dummy gate structure is removed followed by deposition of a replacement gate structure.

Figure 1:
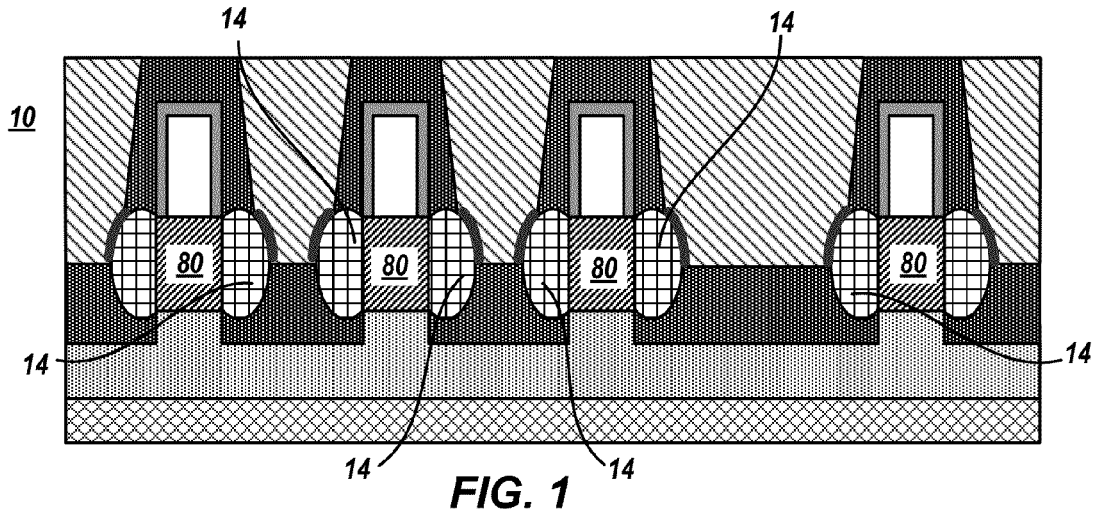
FIG. 1-FIG. 15 depict cross section views of exemplary semiconductor structures at intermediate stages of semiconductor device fabrication, in accordance with various embodiments of the present invention.
Figure 2:
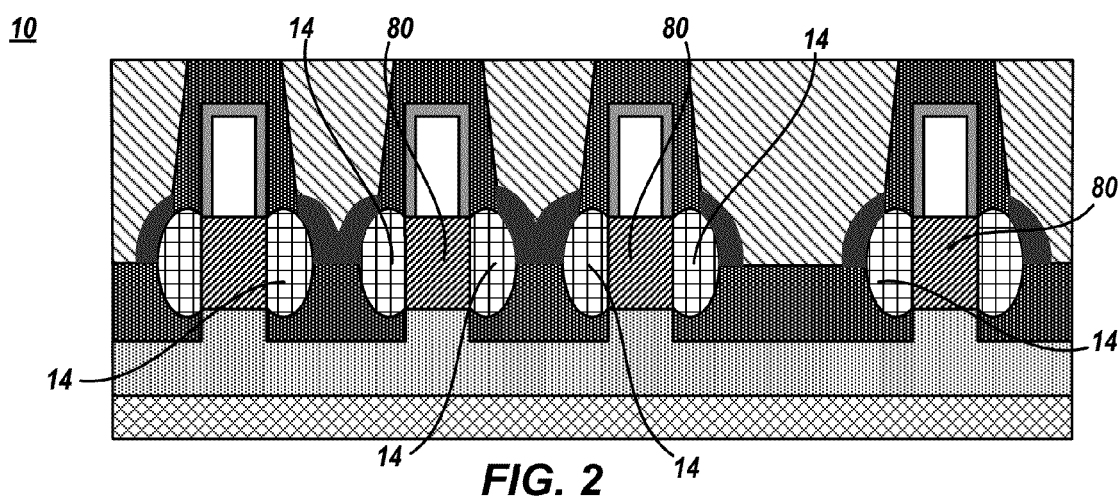
Figure 3:
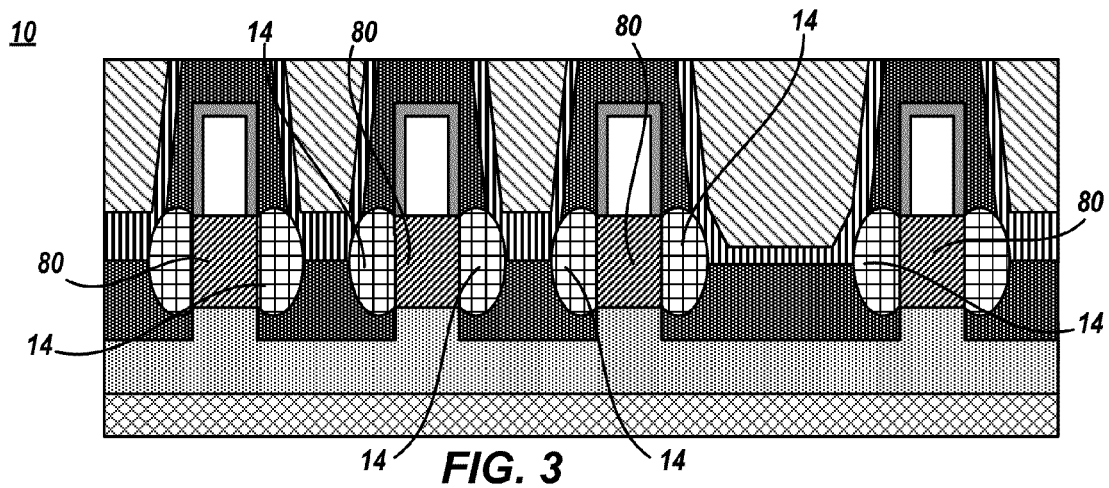

FIG. 1-FIG. 3 depicts cross section views of exemplary semiconductor structures 10 at an intermediate stage of semiconductor device fabrication. In various embodiments, semiconductor structure 10 includes multiple fin portions 80 separated by multiple pitches. A similar amount of unmerged epitaxy 14 (i.e. epitaxial material grown that does not merge with epitaxial material grown from an adjacent fin, portion of the same fin, etc.) may be formed upon the fin portions 80 independent of the associated pitch. The controlled epitaxy 14 formation may lead to e.g. increased dopant variation control within e.g. extension diffusion regions of the semiconductor structure 10. Further, the controlled epitaxy 14 formation limits source drain contact area variations between pitches. In certain embodiments, semiconductor structure 10 may also have uniform fin recesses independent of fin pitch, the formation of which may be better controlled due to fewer geometric variations within the recessing areas.

Referring now to the FIG. 4-FIG. 15 exemplary process steps of forming the exemplary semiconductor structures 10 in accordance with embodiments of the present invention are shown, and will now be described in greater detail below. It should be noted that some of the figures depict a cross section view of structure 10 oriented such that a view perpendicular to the lengths of a plurality of fins and parallel to a plurality of gates are depicted. Furthermore, it should be noted that while this description may refer to some components of the structure 10 in the singular tense, more than one component may be depicted throughout the figures and like components are labeled with like numerals. The specific number of components depicted in the figures and the cross section orientation was chosen for illustrative purposes only.

Figure 4:
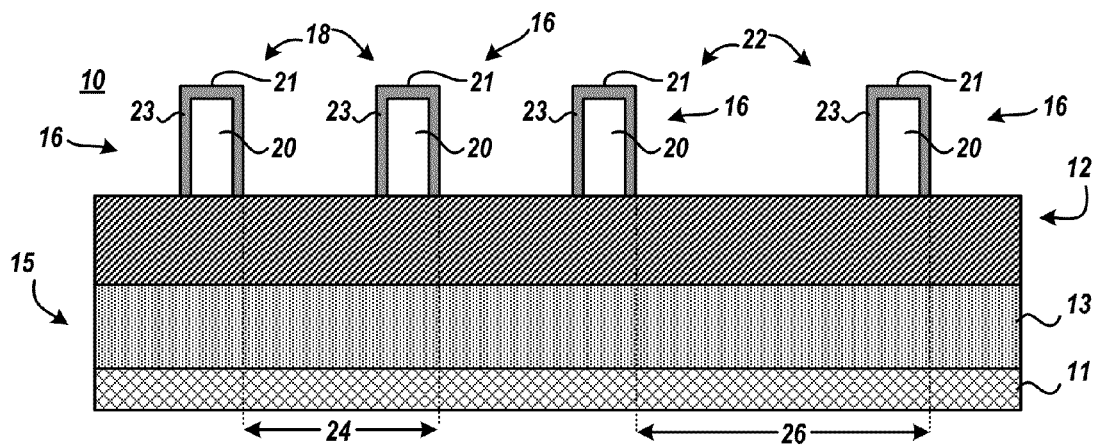

FIG. 4 depicts a cross section view of a semiconductor structure 10 at an intermediate stage of semiconductor device fabrication, in accordance with various embodiments of the present invention. At this stage of fabrication, fins 12 and gate stacks 16 are formed upon substrate 15.

Substrate 15 may be, for example, a layered substrate such as a silicon-on-insulator (SOI), a SiGe-on-insulator (SGOI) or III-V on insulator. Substrate 15 may include a base substrate 11, a buried dielectric layer 13 formed on top of the base substrate, and a SOI layer formed on top of the buried dielectric layer. The buried dielectric layer 13 may isolate the SOI layer from the base substrate. Fins 12 may be etched from the SOI layer. Note, though one fin 12 is shown in e.g. FIG. 4, additional fins 12, visible at various cross sections into or out of the page, may be further formed. The base substrate 11 may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically the base substrate 11 may be about, but is not limited to, several hundred microns thick. For example, the base substrate may have a thickness ranging from 0.5 mm to about 1.5 mm.

The buried dielectric layer 13 may include any of several dielectric materials, for example, oxides, nitrides and oxynitrides of silicon. The buried dielectric layer 13 may also include oxides, nitrides and oxynitrides of elements other than silicon. In addition, the buried dielectric layer 13 may include crystalline or non-crystalline dielectric material. Moreover, the buried dielectric layer 13 may be formed using any of several known methods, for example, thermal or plasma oxidation or nitridation methods, chemical vapor deposition methods, and physical vapor deposition methods. The buried dielectric layer 13 may have a thickness ranging from about 5 nm to about 250 nm. In one embodiment, the buried dielectric layer may have a thickness ranging from about 120 nm to about 200 nm.

The SOI layer may include any of the several semiconductor materials included in the base substrate. In general, the base substrate and the SOI layer may include either identical or different semiconducting materials with respect to chemical composition, dopant concentration and crystallographic orientation. The base substrate 11 and the SOI layer include semiconducting materials that include at least different crystallographic orientations. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins 12 may be etched from the SOI layer. Because the plurality of fins 12 may be etched from the SOI layer, they too may include any of the characteristics listed above for the SOI layer.

Semiconductor structure 10 may also include a plurality of gate stacks 16. Gate stack 16 may include, for example, a gate 20, a gate cap 21, and a spacer 23, etc. Generally, gate stack 16 may be formed by using widely known techniques. For example, gate stack 16 may be formed by first providing a gate dielectric layer (not shown) atop structure 10 (i.e. upon substrate 15 and fins 12) utilizing a conventional deposition process including, for example, chemical vapor deposition, plasma enhanced chemical vapor deposition or chemical solution deposition. Gate 20 may be formed upon the gate dielectric and a gate cap 21 may be formed atop gate 20. Spacers 23 may be formed on sides of gate 20, gate cap 21, etc. Generally, gate stack 16 may be formed by other known processes without deviating from the spirit of those embodiments herein claimed.

In various embodiments a gate stack 16 pair 22 is separated by a pitch 26 that is greater than a pitch 24 that separates a gate stack 16 pair 18. Pitch 24 may have a width that ranges from e.g. 30 nm to 300 nm, although lesser and greater thickness have also been contemplated herein. For example, pitch 24 may be 64 nm. Generally, pitch 26 is wider than pitch 24 and may have a width equal to an integer multiplied by the width of pitch 24. For example, pitch 26 may have a width equal to 2×, 3×, 4×, 5× the width of pitch 24. Therefore, pitch 26 may be 128 nm, 320 nm, etc.

Figure 5:
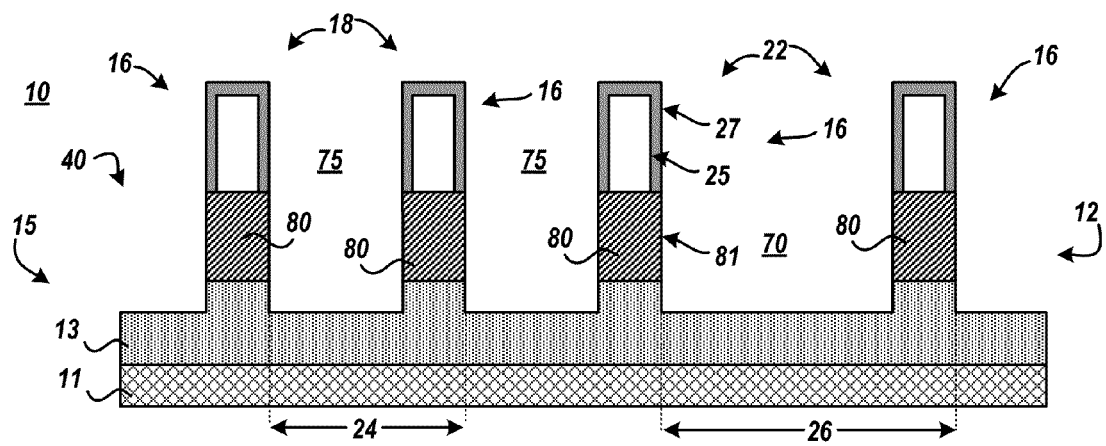

FIG. 5 depicts a cross section view of an exemplary semiconductor structure 10 at an intermediate stage of semiconductor device fabrication, in accordance with various embodiments of the present invention. At this stage of fabrication, recess regions 70 and recess regions 75 are formed. In certain embodiments, recess regions 70 and recess regions 75 may be formed by removing portions of fins 12. In certain embodiments, recess regions 70 and recess regions 75 may be formed by removing portions of fins 12 and portions of substrate 15. Recess regions 70 and recess regions 75 may be formed to increase the stress coupling in e.g. FinFETs.

The portions of fins 12 and/or portions of substrate 15 (e.g. dielectric layer 13, etc.) may be removed using any suitable etching technique such as dry etch, wet etch, or combination of both. The portions of fins 12 may be removed by e.g. known patterning and etching procedures of the VLSI arts, such as, for instance, reactive ion etching (RIE). A first etch process may remove portions of fins 12 and may penetrate to an upper surface of substrate 15 and a second etch process may remove portions of substrate 15. However, in certain embodiments, a single etch process may both remove portions of fins 12 and may remove portions of substrate 15. At this stage of fabrication, the originally continuous fins 12 have been cut into fin portions 80 with each of the gate stacks 16 being associated with one of the fin portions 80. According to various embodiments, recess regions 70 separate fin portions 80 associated with gate stack 16 pair 22 and recess regions 75 separate fin portions 80 associated with gate stack 16 pair 18. In various embodiments, the width of recess region 70 may be equal to the pitch 26 minus the width of gate stack 16. Likewise, the width of recess region 75 may be equal to the pitch 24 minus the width of gate stack 16.

In certain embodiments, fin segment 80 extends or otherwise protrudes past a sidewall 25 of gate 20 such that a sidewall 81 of fin segment 80 is coplanar with a sidewall 27 of gate stack 16 (e.g. sidewall of spacer 23, etc.). In certain embodiments, sidewall 81 is a <110> plane.

The etching procedures may be chosen to obtain a depth and side profile of recess regions 70 and recess regions 75 according to design purposes and to retain one or more crystalline surface(s) for subsequent epitaxy 14 formation. For instance, recess regions 70 and recess regions 75 can be formed by a directional dry etch which can form substantially straight sidewalls or by a wet (or other isotropic) etch process which can form undercuts, etc. In certain embodiments, the depth of recess regions 70 and recess regions 75 may be sufficient to allow for epitaxy formation and inter layer dielectric deposition generally therein as is further described herein. In certain embodiments, the depth of recess regions 70 and recess regions 75 may differ relative thereto. Generally, recess regions 70 and recess regions 75 may be formed by other known processes without deviating from the spirit of those embodiments herein claimed.

Figure 6:
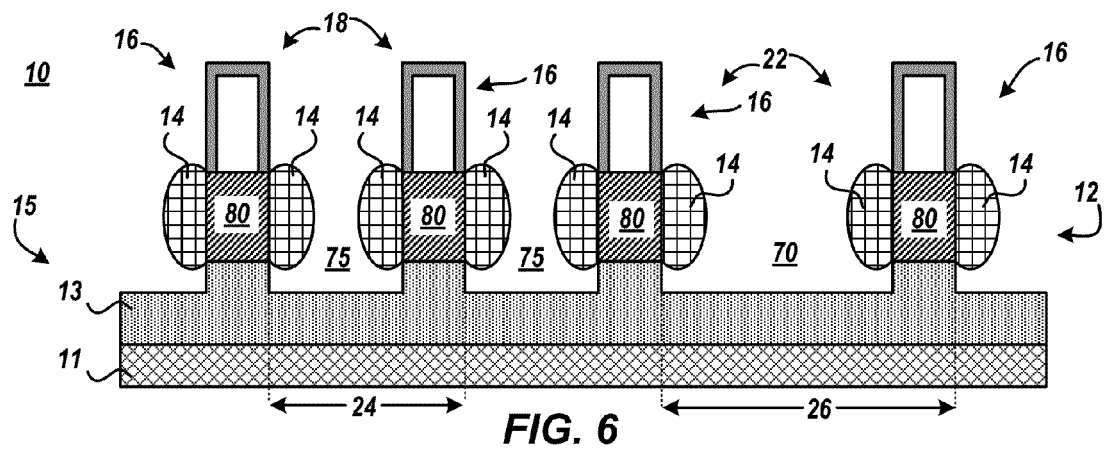

FIG. 6 depicts a cross section view of an exemplary semiconductor structure 10 at an intermediate stage of semiconductor device fabrication, in accordance with various embodiments of the present invention. At this stage of fabrication, unmerged epitaxy 14 is formed upon fin portions 80. In various embodiments, unmerged epitaxy 14 is epitaxial material grown from a sidewall 81 of a fin segment 80 that does not merge with epitaxial material grown from an adjacent fin segment 80 sidewall 81.

Generally, epitaxial growth, grown, deposition, formation, etc. means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking, etc.

A non limiting list of exemplary expitaxial materials are: silicon germanium alloy (SiGe), Silicon (Si), in-situ boron doped SiGe or Si, in situ phosphorus or arsenic doped Si or SiGe, or doped III-V semiconductors with doping concentrations ranging from $1\times10^{19}$ cm$^{-3}$ to $1.5\times10^{21}$ cm$^{-3}$, with $4\times10^{20}$ cm$^{-3}$ to $9\times10^{20}$ cm$^{-3}$ dopant levels preferred.

Generally, epitaxy 14 formed upon fin segment 80 sidewalls. In various embodiments, substrate 15 has a <100> orientation and fin segment 80 sidewalls have a <110> orientation. Epitaxy is grown off the fin segment 80 sidewalls and an epitaxy 14 structure is grown.

The material of the fins 12 may itself serve as the seed surface for the epitaxial growth of the material of epitaxy 14. The epitaxy 14 growth may be carried out in a selective manner, meaning that the epitaxial growth occurs only over exposed semiconductor surfaces, for instance over the fin portions 80 while other surfaces (e.g. surfaces of dielectrics) stay essentially free of the epitaxy material. Selective epitaxial growth has known techniques in the art.

In representative embodiments of the invention the epitaxy 14 material may have resulted from epitaxial growth on the side surfaces of fin portions 80. In certain embodiments, the epitaxial growth may be timed and stopped such that each epitaxy material 14 is generally uniform. For instance, the geometric properties of epitaxy 14 associated with gate stack 16 pair 22 are similar to epitaxy 14 associated with gate stack 16 pair 18. The epitaxial growth may be timed and stopped prior to epitaxy 14 merging.

In certain embodiments, epitaxy material 14 may be doped. Such doping may be performed during the epitaxial growth, in so called in-situ doping schemes, as known in the art. Both p-type and n-type dopants are well known in the art, and any of them may be used in the embodiments of the present disclosure for doping both the fin 12 material and the epitaxy 14 material.

A further consideration in selecting the fin 12 material and the epitaxy 14 material may involves the state of stress in each. If the epitaxy 14 material has a larger lattice constant than the fin 12 material, epitaxy material 14 applies a compressive stress onto the channel region. It is well known that the lattice constant of Si:C is smaller than that of Si, approximately in proportion with the carbon content. It is also known that the lattice constant of SiGe is larger than that of Si, approximately in proportion with the germanium content. Consequently, the selection of the epitaxy 14 material may also depend on the desired stress state in the channels of the FinFET devices Consequently, for NFET devices, where the channel carriers are electrons and tensile stress is advantageous in the channel, one may select the fin 12 material to be essentially Si or a SiGe alloy, and the epitaxy material 14 to be Si:C with between 1% and 5% C concentration, or SiGe alloy with lesser Ge concentration than channel material. With such a selection the second material may impart a tensile stress onto the fins, resulting in a tensile stress in the FinFET device channel. For PFET devices, where the channel carriers are holes and compressive stress is advantageous in the channel, one may select the fin 12 material to be essentially Si or a SiGe alloy mixture, and the epitaxy 14 material to be SiGe alloy a higher Ge concentration than the channel material. With such a selection the epitaxy 14 material may impart a compressive stress onto the fins 12, resulting in a compressive stress in the FinFET device channel. In further embodiments of the invention it may occur that the stress, which would arise from lattice constant differences between the fin 12 material and the epitaxy 14 material, becomes relaxed due to lattice defects, such as dislocations. Generally, epitaxy 14 may be formed by other known processes without deviating from the spirit of those embodiments herein claimed.

Figure 7:
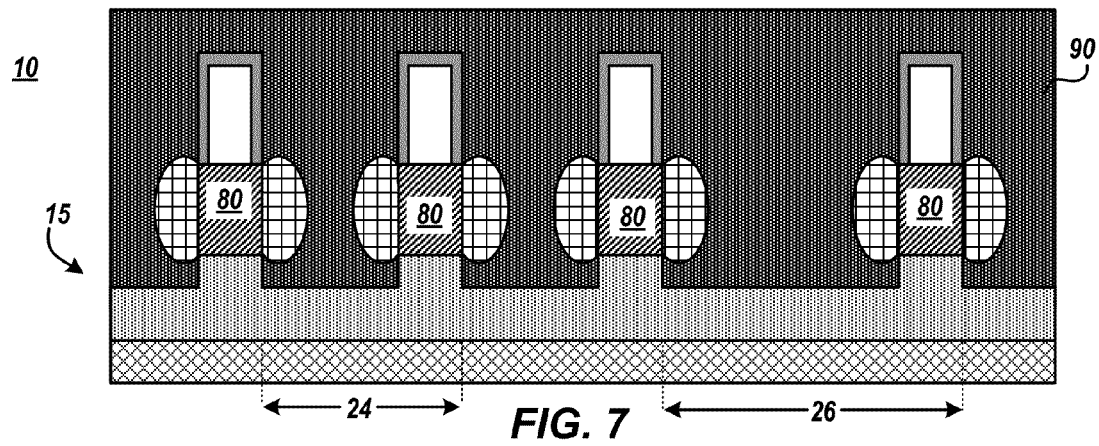

FIG. 7 depicts a cross section view of an exemplary semiconductor structure 10 at an intermediate stage of semiconductor device fabrication, in accordance with various embodiments of the present invention. At this stage of fabrication, interlayer dielectric (ILD) 90 is formed upon structure 10. For example, ILD 90 may be formed upon substrate 15, within recess regions 70 and recess regions 75 surrounding exposed epitaxy 14, surrounding gate stacks 16, etc. ILD 90 may be formed to a thickness to cover gate stacks 16 (e.g. an upper surface of ILD 90 is above the upper surfaces of gates stacks 16, etc.). In various embodiments of the present invention the materials of ILD 90 and epitaxy material 14 are chosen to provide for subsequent selective etching. Such requirement may be satisfied by different combinations of material selections. ILD 90 may be formed by any now known or later developed techniques such as plasma vapor deposition, etc.

Figure 8:
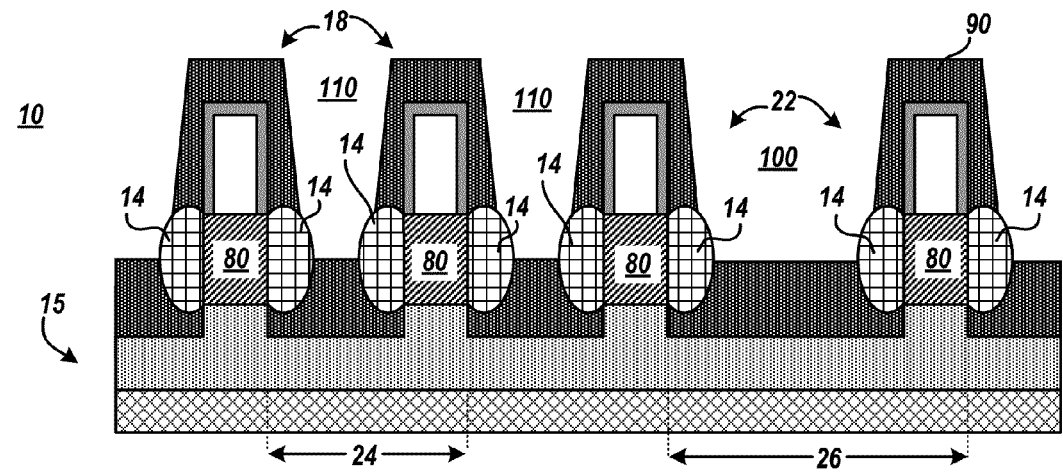

FIG. 8 depicts a cross section view of an exemplary semiconductor structure 10 at an intermediate stage of semiconductor device fabrication, in accordance with various embodiments of the present invention. At this stage of fabrication, contact trenches 100 and contact trenches 110 are formed upon structure 10. Contact trench 100 is associated with gate stack pair 22/pitch 26 and is therefore generally larger than contact trench 110 associated with gate stack pair 18/pitch 24.

Contact trenches 100 and contact trenches 110 may be formed utilizing photolithography and etch process steps. Specifically, a pattern is produced by applying a masking layer such as a photoresist or photoresist with an underlying hardmask, to the surface to ILD 90. The photoresist is exposed to a pattern of radiation and the pattern is developed into the photoresist utilizing a resist developer. Once the patterning of the photoresist is completed, the sections covered by the photoresist are protected while the exposed regions are removed using a selective etching process that removes the unprotected regions. In the present fabrication stage, the etching is selective to remove the material of ILD 90 while not removing material of epitaxy 14. As such, a respective portion of epitaxy 14 may be exposed within the contact trenches 100 and contact trenches 110. In various embodiments, contact trenches 100 and contact trenches 110 are formed within source and drain regions of structure 10 and may be subsequently utilized in forming a contact electrically coupled to respective source drain regions.

The patterning and etching techniques may be chosen to obtain a depth and side profile of contact trenches 100 and contact trenches 110 according to design purposes. For instance, contact trenches 100 and contact trenches 110 can be formed by a directional dry etch which can form substantially straight sidewalls or by a wet (or other isotropic) etch process which can form undercuts, etc. Generally, contact trenches 100 and contact trenches 110 may be formed by other known processes without deviating from the spirit of those embodiments herein claimed.

The contact trenches 100 and contact trenches 110 may be self-aligned in that they are formed through ILD 90 using an etch process that is selective to epitaxy. That is, the etch process used to form contact trenches 100 and contact trenches 110 may not appreciably remove the material of epitaxy 14, thereby making the alignment of the mask for the etch process less critical.

Figure 9:
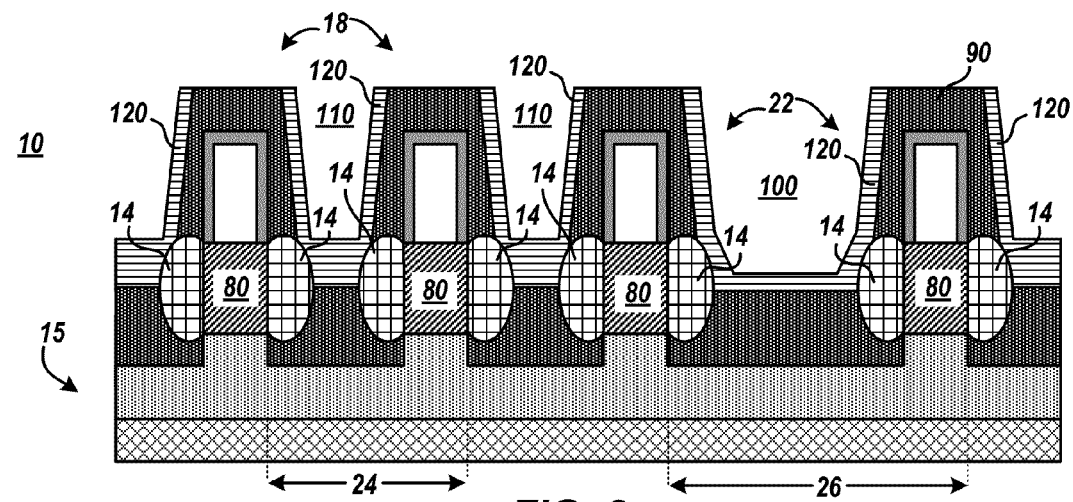

FIG. 9 depicts a cross section view of an exemplary semiconductor structure 10 at an intermediate stage of semiconductor device fabrication, in accordance with various embodiments of the present invention. At this stage of fabrication, silicide metal layer 120 is formed within contact trenches 100 and contact trenches 110.

Silicide metal layer 120 may be for example, Nickel silicide (NiSi), platinum silicide (PtSi), group 1 silicide, group 2 silicide, etc. deposited upon the sidewalls of contact trenches 100, sidewalls of contact trenches 110, and upon the exposed portions of epitaxy 14 therein. Silicide metal layer 120 may be formed by any now known or later developed techniques appropriate for the material of silicide metal layer 120, including, but not limited to: chemical vapor deposition (CVD), low pressure CVD (LPCVD), plasma enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation, etc. Silicide metal layer 120 may have a thickness ranging from about 3 nm to about 50 nm. In one embodiment, the silicide metal layer 120 may have a thickness ranging from about 5 nm to about 15 nm.

Figure 10:
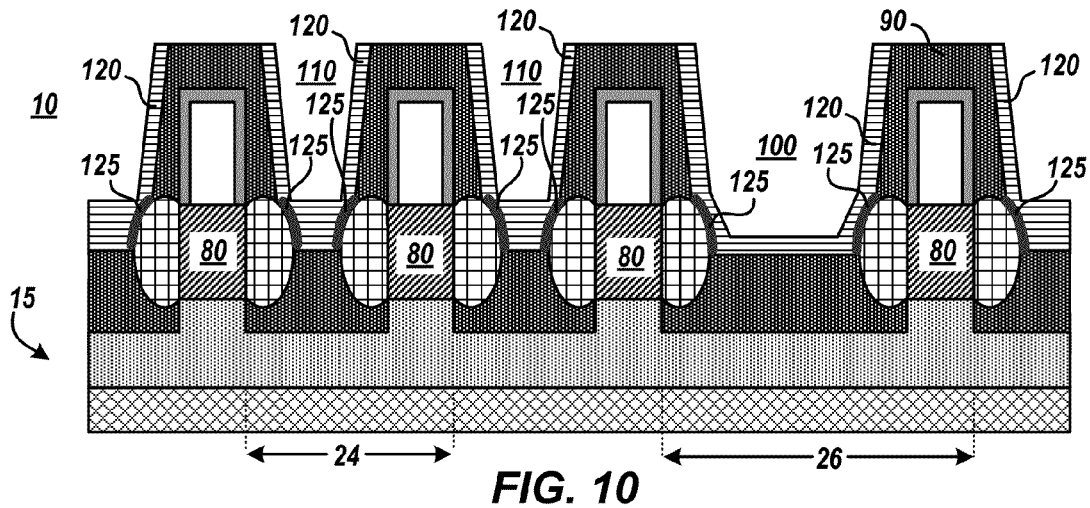
Figure 11:
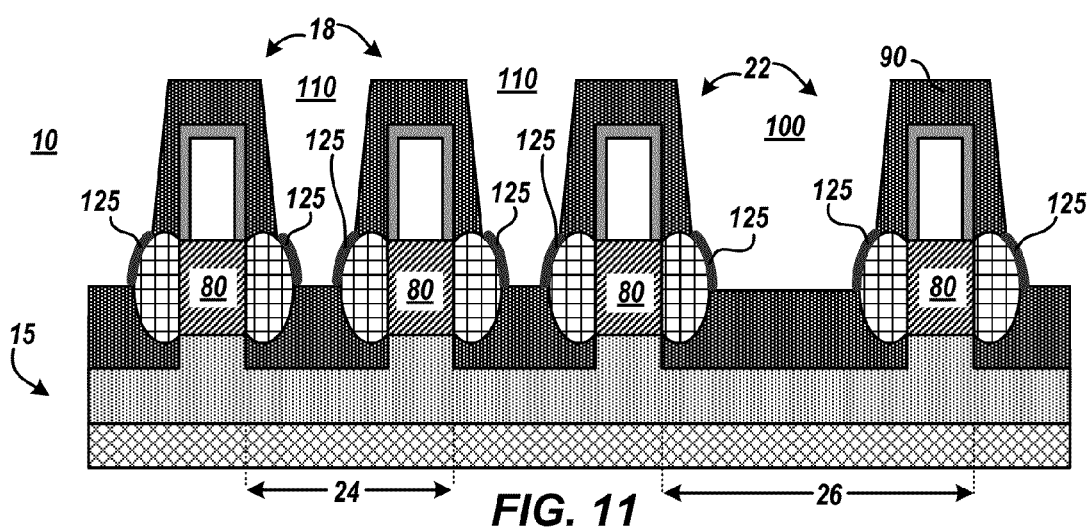

In certain embodiments, as shown in FIG. 10, silicide metal layer 120 may be prepared by a self-aligned salicide process wherein metal contacts 125 are formed by annealing silicide metal layer 120. Metal contacts 125 are generally the reacted metal components of silicide metal layer 120 in contact with the exposed portions of epitaxy 14 within contact trenches 100 and contact trenches 110. An exemplary salicide process begins with heating structure 10, allowing the transition metal of silicide metal layer 120 react with exposed silicon in e.g. source drain regions of structure 10. The transition metal typically does not react with silicon dioxide or silicon nitride dielectrics present upon structure 10. Following the reaction, remaining silicide metal layer 120 may be removed, as shown in FIG. 11, by chemical etching, leaving metal contacts 125 upon the exposed portions of epitaxy 14 within contact trenches 100 and contact trenches 110. In certain embodiments, the silicide processes may include more complex techniques, involving additional anneals, surface treatments, etch processes, etc.

Figure 12:
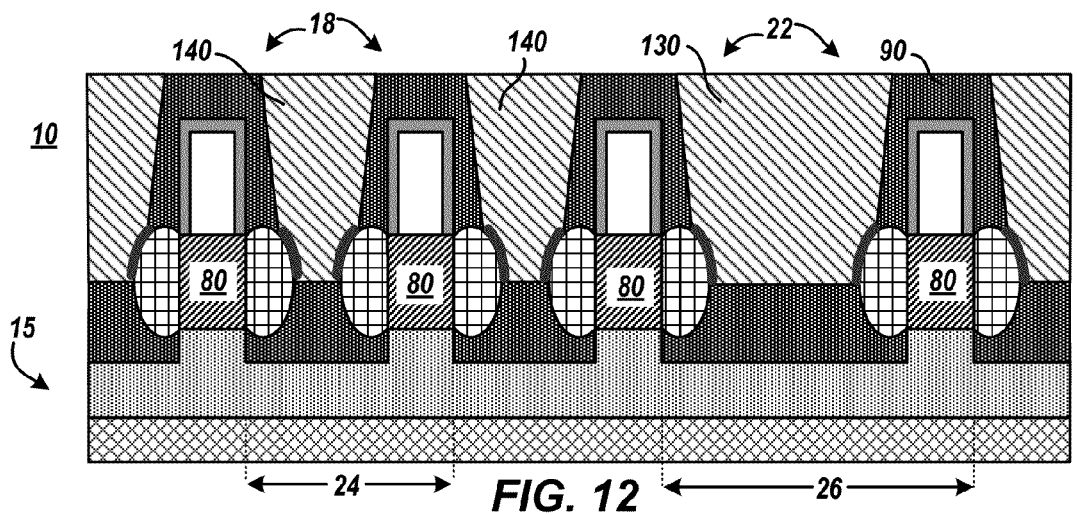

FIG. 12 depicts a cross section view of an exemplary semiconductor structure 10 at an intermediate stage of semiconductor device fabrication, in accordance with various embodiments of the present invention. At this stage of fabrication, contacts 130 and contacts 140 are formed by filling contact trenches 100 and contact trenches 110, respectively, with electrically conductive material (e.g., a metal, a metal-containing material, a material comprising a metal).

In certain embodiments, contacts 130 and contacts 140 may be e.g. tungsten, copper, etc. Contacts 130 are generally formed within contact trench 100 and electrically contact metal contacts 125 therein. Likewise, contacts 140 are generally formed within contact trench 110 and electrically contact metal contacts 125 therein. Further, contacts 130 and contacts 140 provide for an electrical connection to respective active regions e.g. source drain regions of semiconductor structure 10. Even further, contacts 130 and contacts 140 provide for an electrical connection with another component(s) formed above contacts 130 and contacts 140, respectively. Such components may be formed in subsequent Front End of the Line, Middle End of the Line, etc. fabrication steps. In certain embodiments, after forming contacts 130 and contacts 140, structure 10 may be planarized utilizing e.g. a chemical mechanical polish (CMP) so that an upper surface of ILD 90, upper surfaces of contacts 130, and upper surfaces of contacts 140 are coplanar. For clarity, structure 10 may undergo further fabrication steps that may add or remove layers, materials, etc. in further front end of line, middle end of line, or back end of line fabrication steps to form a semiconductor device.

Figure 13:
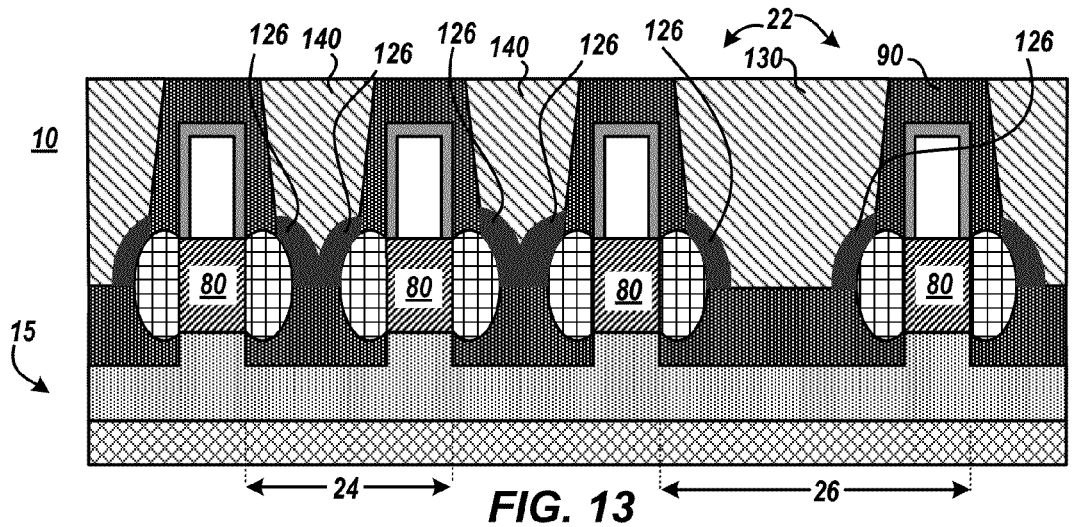

In certain embodiments, as shown in FIG. 13, silicide metal layer 120 may be formed to a thickness sufficient to form merged contacts 126 within contact trenches 110. For example, silicide processes may be utilized such that silicide metal layer 120 may be annealed to react more of the silicide metal layer 120 as compared with embodiments as shown in FIG. 10. Upon stripping the un-reacted silicide metal layer 120, merged contacts 126 remain. In various embodiments, merged contacts 126 may be fused metal of reacted silicide metal layer 120 at least within contact trenches 110. Like contacts 125, merged contacts 126 are formed upon the exposed epitaxy 14 within contact trenches 100 and contact trenches 110. Merged contacts 126 are formed to geometry to merge with respective neighboring contacts 126 at least within contact trenches 110. Because contact trench 100 is larger than contact trenches 110, in some embodiments, merged contacts 126 may not merge within trench 100. In such embodiments, a bottom surface within contact trench 100 may remain exposed.

Figure 14:
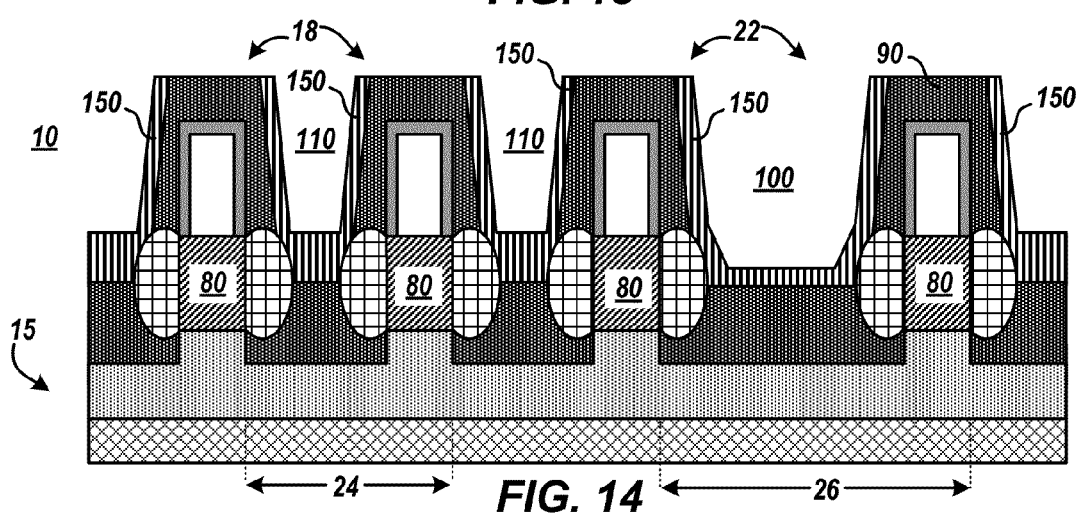
Figure 15:
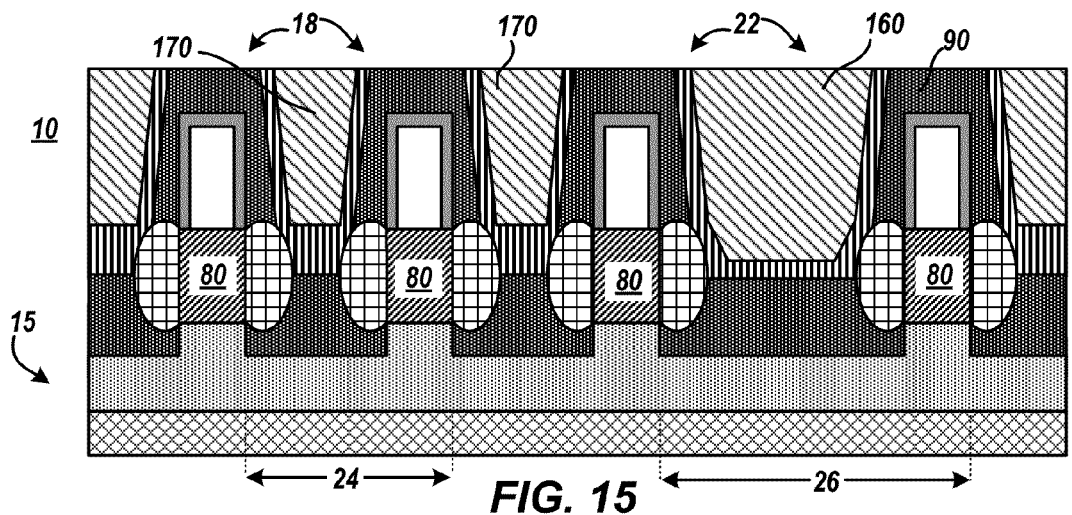

In certain embodiments, as shown in FIG. 14, a liner 150 such as titanium nitride may be deposited within contact trenches 100 and contact trenches 110. For example, liner 130 may be formed upon the sidewalls of contact trenches 100 and contact trenches 110, upon the bottom surfaces of contact trenches 100 and contact trenches 110, and upon the exposed portions of epitaxy 14. In such embodiments, the remaining contact trenches 100 and contact trenches 110 may be filled with electrically conductive material forming contacts 160 and contacts 170, as shown in FIG. 15. Contacts 160 and contacts 170 may be e.g. tungsten, copper, etc. Contacts 160 are generally formed within contact trench 100 and electrically contact liner 150 therein. Likewise, contacts 170 are generally formed within contact trench 110 and electrically contact liner 150 therein. Further, contacts 160 and contacts 170 provide for an electrical connection to respective active regions e.g. source drain regions of semiconductor structure 10. Even further, contacts 160 and contacts 170 provide for an electrical connection with another component(s) formed above contacts 160 and contacts 170, respectively. In certain embodiments, after forming contacts 160 and contacts 170, structure 10 may be planarized utilizing e.g. a chemical mechanical polish (CMP) so that an upper surface of ILD 90, upper surfaces of contacts 160, and upper surfaces of contacts 170 are coplanar. For clarity, structure 10 may undergo further fabrication steps that may add or remove layers, materials, etc. in further front end of line, middle end of line, or back end of line fabrication steps to form a semiconductor device.

Figure 16:
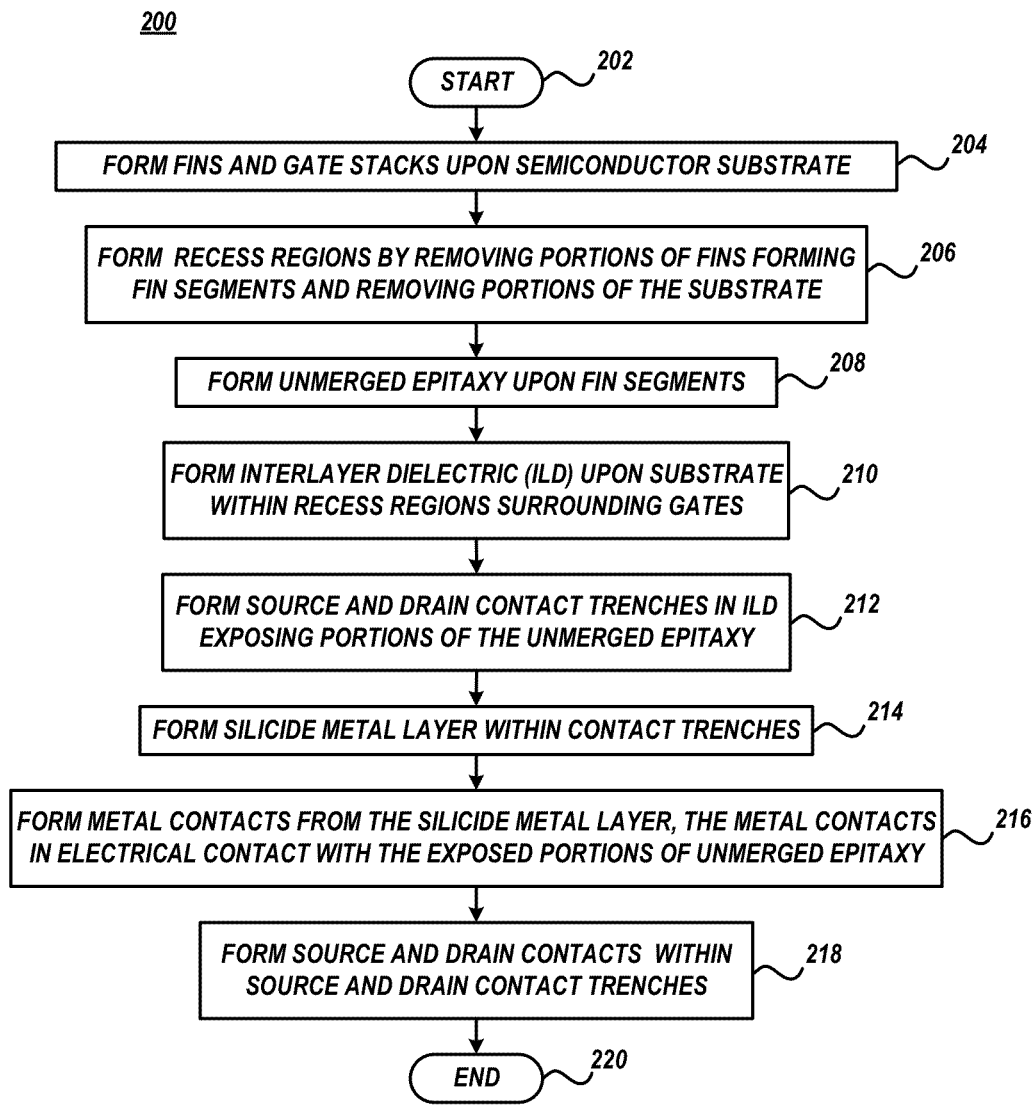
FIG. 16 and FIG. 17 depict exemplary fabrication process flow methods, in accordance with various embodiments of the present invention.

FIG. 16 depicts an exemplary process flow method 200 for manufacturing a semiconductor device, in accordance with various embodiments of the present invention. In various embodiments, method 200 may be utilized to form semiconductor structure 10 that includes multiple fin portions 80 separated by multiple pitches. Method 200 may be utilized to form a similar amount of unmerged epitaxy 14 upon the fin portions 80 independent of the associated pitch. The controlled epitaxy 14 formation of method 200 may lead to e.g. increased dopant variation control within e.g. extension diffusion regions of the semiconductor structure 10. Further, the controlled epitaxy 14 formation of method 200 may limit source drain contact area variations between pitches. Further, of method 200 may be utilized to form uniform recesses independent of the pitch that may be increasingly controlled due to fewer geometric variations within the recesses.

Method 200 begins at block 202 and continues by forming fins 12 and forming gate stacks 16 upon substrate 15 of semiconductor structure 10 (block 204). The gate stacks 16 may be formed generally orthogonal to fins 12.

Method 200 may continue with forming recess regions 70 and recess regions 75 (block 206). In certain embodiments, recess regions 70 and recess regions 75 may be formed by removing portions of fins 12 and portions of substrate 15. The portions of fins 12 that are retained may form fin portions 80. Recess regions 70 separate fin portions 80 associated with gate stack 16 pair 22 and/or pitch 26 and recess regions 75 separate fin portions 80 associated with gate stack 16 pair 18 and/or pitch 24. Recess regions 70 and recess regions 75 may be formed to increase the stress coupling in e.g. FinFETs. The formation of recess regions 70 and recess regions 75 is uniform since the recesses have similar depths and because of relatively similar geometric properties of the recess regions 70 and the recess regions 75.

Method 200 may continue with forming unmerged epitaxy 14 upon the fin semgments 80 (block 208). The material of the fins 12 may itself serve as the seed surface for the epitaxial growth of the material of epitaxy 14. The epitaxy 14 growth may be carried out in a selective manner, meaning that the epitaxial growth occurs only over certain surfaces, for instance over the fin portions 80 while other surfaces stay essentially free of the epitaxy material. In representative embodiments of the invention the epitaxy 14 material may have resulted from epitaxial growth on the side surfaces of fin portions 80. In certain embodiments, the epitaxial growth may be timed and stopped such that each epitaxy 14 is generally uniform. For instance, the geometric properties of epitaxy 14 associated with gate stack 16 pair 22 are similar to epitaxy 14 associated with gate stack 16 pair 18. The epitaxial growth may be timed and stopped prior to epitaxy 14 merging.

Method 200 may continue with forming ILD 90 upon substrate 15 within recess regions 70 and recess regions 75 surrounding gate stacks 16 (block 210). Further, ILD 90 may be formed surrounding the exposed epitaxy 14. ILD 90 may be formed to a thickness to cover gate stacks 16.

Method 200 may continue with forming source and drain contact trenches 100, 110 (block 212). Contact trench 100 is associated with gate stack pair 22/pitch 26 and is therefore generally larger than contact trench 110 associated with gate stack pair 18/pitch 24. Contact trenches 100 and contact trenches 110 may be formed utilizing photolithography and etch process steps. The etching may be selective to remove the material of ILD 90 while not removing material of epitaxy 14. As such, a respective portion of epitaxy 14 may be exposed within the contact trenches 100 and contact trenches 110. The contact trenches 100 and contact trenches 110 may be self-aligned in that they are formed through ILD 90 using an etch process that is selective to epitaxy 14. That is, the etch process used to form contact trenches 100 and contact trenches 110 may not appreciably remove the material of epitaxy 14, thereby making the alignment of the etch mask less critical.

Method 200 may continue with forming silicide metal layer 120 within contact trenches 100 and contact trenches 110 (block 214). In certain embodiments, silicide metal layer 120 may be formed in association with self-aligned salicide processes. In certain embodiments, metal contacts 125 may be formed from the silicide metal layer 120 (block 216) by, for example, annealing silicide metal layer 120. Metal contacts 125 may be the reacted metal components of silicide metal layer 120 in contact with the exposed portions of epitaxy 14 within contact trenches 100 and contact trenches 110. In other embodiments, silicide metal layer 120 may be formed to a thickness sufficient to form merged contacts 126 within contact trenches 100 and/or contact trenches 110. Merged contacts 126 may be fused metal of reacted silicide metal layer 120 at least within contact trenches 110. In some embodiments, merged contacts 126 may not merge within trenches 100 since they are larger than trenches 110. In such embodiments, a bottom surface within contact trenches 100 may remain exposed.

An exemplary salicide process begins with heating structure 10, allowing the transition metal of silicide metal layer 120 react with exposed silicon in e.g. source drain regions of structure 10. Following the reaction, remaining silicide metal layer 120 may be removed, by e.g. chemical etching, leaving metal contacts 125 upon the exposed portions of epitaxy 14 within contact trenches 100 and contact trenches 110.

Method 200 may continue with forming source and drain contacts 130, 140 within the contact trenches 100 and contact trenches 110 (block 218). Contacts 130 and contacts 140 may be formed by filling contact trenches 100 and contact trenches 110, respectively, with electrically conductive material. Contacts 130 and contacts 140 provide for an electrical connection to source drain regions of semiconductor structure 10. Even further, contacts 130 and contacts 140 provide for an electrical connection with another component(s) formed above contacts 130 and contacts 140, respectively. For clarity, method 200 may continue with further fabrication steps that may add or remove layers, materials, etc. in further front end of line, middle end of line, or back end of line fabrication steps to form a semiconductor device. Method 200 ends at block 220.

Figure 17:
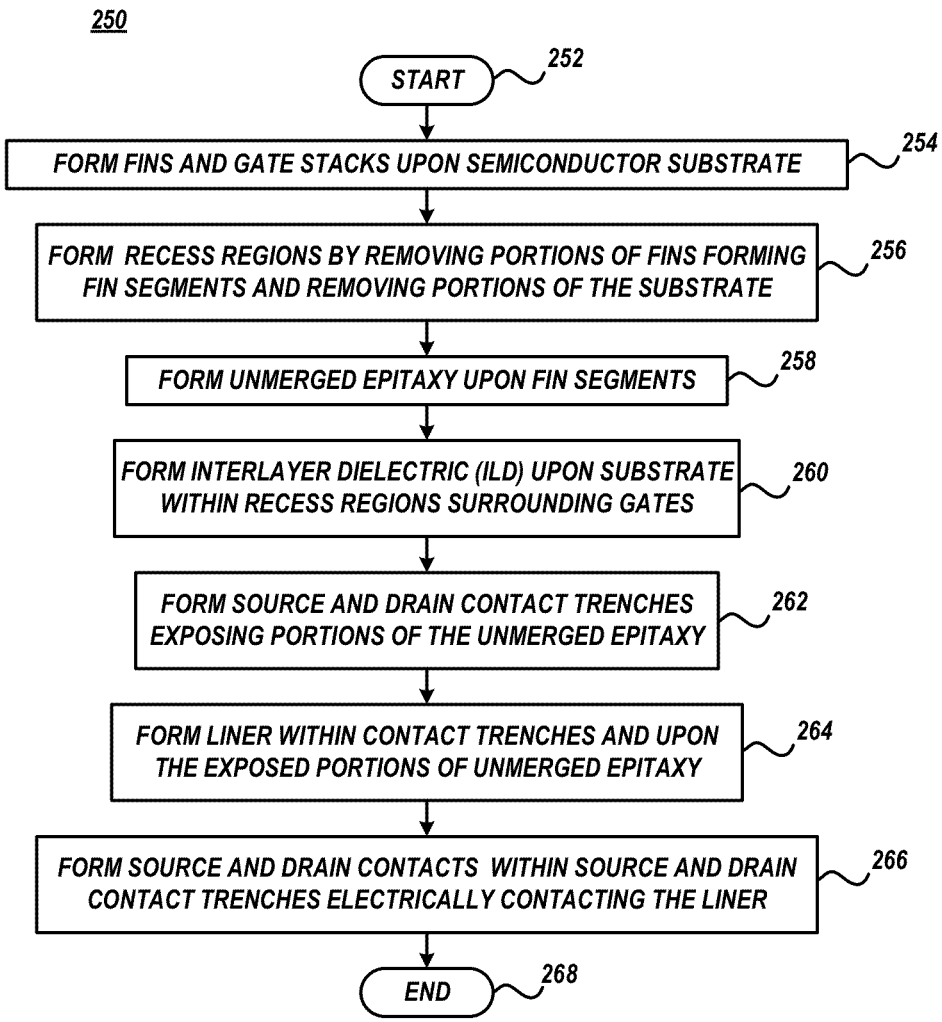

FIG. 17 depicts an exemplary process flow method 250 for manufacturing a semiconductor device, in accordance with various embodiments of the present invention. In various embodiments, method 250 may be utilized to form semiconductor structure 10 that includes multiple fin portions 80 separated by multiple pitches. Method 250 may be utilized to form a similar amount of unmerged epitaxy 14 upon the fin portions 80 independent of the associated pitch. The controlled epitaxy 14 formation of method 250 may lead to e.g. increased dopant variation control within e.g. extension diffusion regions of the semiconductor structure 10. Further, the controlled epitaxy 14 formation of method 250 may limit source drain contact area variations between pitches. Further, of method 250 may be utilized to form uniform recesses independent of the pitch that may be increasingly controlled due to fewer geometric variations within the recesses.

Method 250 begins at block 252 and continues by forming fins 12 and forming gate stacks 16 upon substrate 15 of semiconductor structure 10 (block 254). Method 250 may continue with forming recess regions 70 and recess regions 75 (block 256). Method 250 may continue with forming unmerged epitaxy 14 upon the fin portions 80 (block 258). Method 250 may continue with forming ILD 90 upon substrate 15 within recess regions 70 and recess regions 75 surrounding gate stacks 16 (block 260). Method 250 may continue with forming source and drain contact trenches 100, 110 (block 262).

Method 250 may continue with forming liner 150 within trenches 100 and within trenches 110 generally upon the exposed portions of epitaxy 14 (block 264). For example, liner 130 may be formed upon the sidewalls of contact trenches 100 and contact trenches 110, upon the bottom surfaces of contact trenches 100 and contact trenches 110, and upon the exposed portions of epitaxy 14.

Method 250 may continue with filling the remaining contact trenches 100 and contact trenches 110 with electrically conductive material forming contacts 160 and contacts 170 (block 266). Contacts 160 and contacts 170 electrically contact liner 150 within contact trenches 100 and contact trenches 110, respectively. Contacts 160 and contacts 170 may provide for an electrical connection to source drain regions of semiconductor structure 10. Contacts 160 and contacts 170 may also provide for an electrical connection with another component(s) formed above contacts 160 and contacts 170, respectively. After forming contacts 160 and contacts 170, structure 10 may be planarized utilizing e.g. a chemical mechanical polish (CMP) so that an upper surface of ILD 90, upper surfaces of contacts 160, and upper surfaces of contacts 170 are coplanar. For clarity, method 250 may continue with further fabrication steps that may add or remove layers, materials, etc. in further front end of line, middle end of line, or back end of line fabrication steps to form a semiconductor device. Method 250 ends at block 268.

Figure 18:
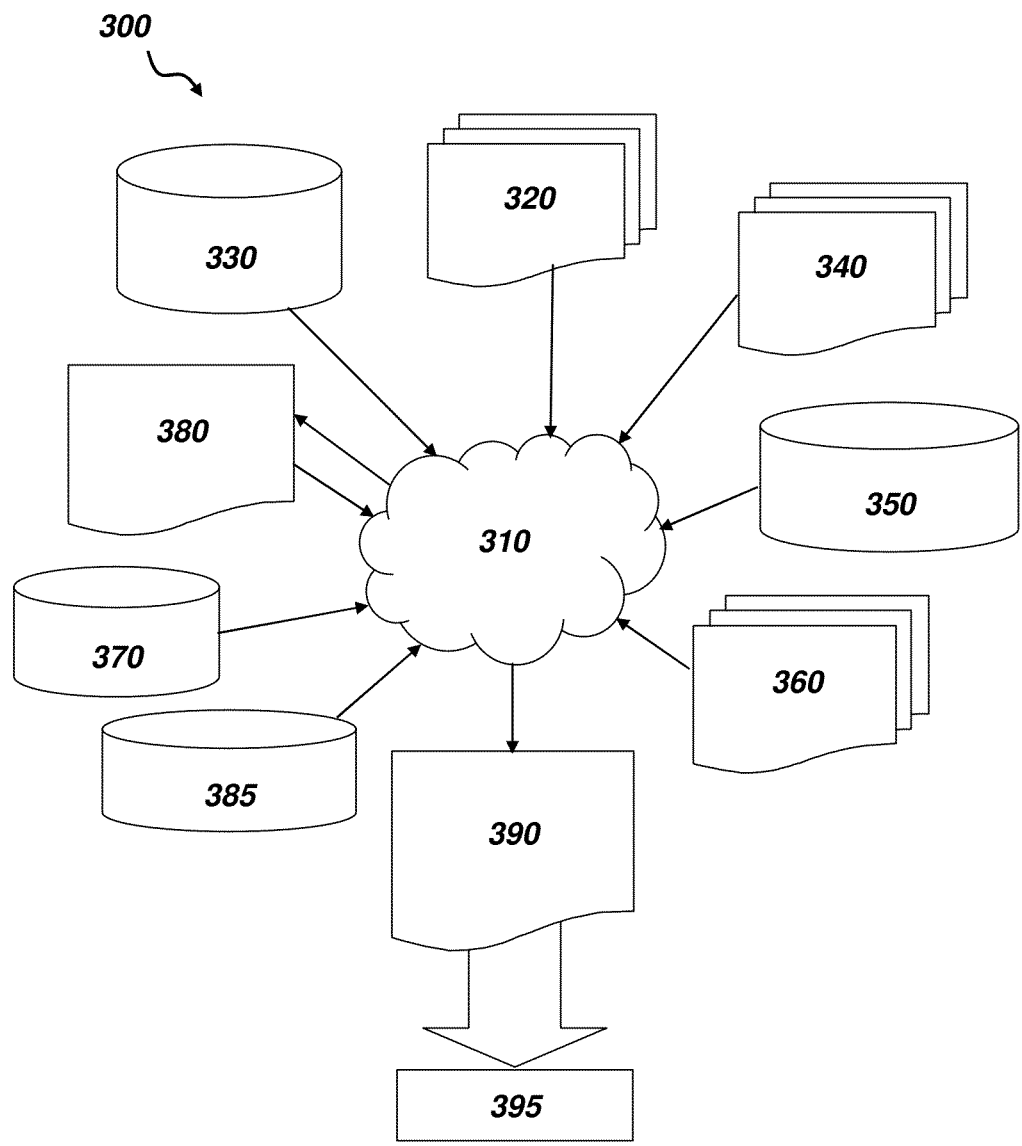
FIG. 18 depicts a flow diagram of a design process used in semiconductor design, manufacture, and/or test, in accordance with various embodiments of the present invention.

Referring now to FIG. 18, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-15.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-15. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-15 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-15. In one embodiment, design structure 390 may comprise a compiled, executable HDL simulation model that functionally simulates the devices shown in FIGS. 1-15.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and as shown in FIGS. 1-15. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication process comprising:
   forming a plurality of fins upon a semiconductor substrate and forming a plurality of gate stacks upon the semiconductor substrate orthogonal to the plurality of fins;
   forming fin portions by recessing the plurality of fins and semiconductor substrate adjacent to the plurality of gate stacks, and;
   forming uniform unmerged epitaxy upon the fin portions.

2. The semiconductor device fabrication process of claim 1, wherein a first gate stack pair is separated by a first pitch and a second gate stack pair is separated by a second pitch greater than the first pitch.

3. The semiconductor device fabrication process of claim 1, wherein sidewalls of the fin portions are coplanar with sidewalls of the gate stacks.

4. The semiconductor device fabrication process of claim 2, further comprising:
   forming a dielectric upon the semiconductor substrate within the recesses contacting associated epitaxy and surrounding the plurality of gate stacks.

5. The semiconductor device fabrication process of claim 4, further comprising:
   forming a contact trench within the dielectric between the first gate stack pair and between the second gate stack pair, the contact trench revealing portions of associated epitaxy.

6. The semiconductor device fabrication process of claim 5, further comprising:
   forming a contact by filling the contact trench with electrically conductive material.

7. The semiconductor device fabrication process of claim 6, further comprising:
   forming a salicide layer upon the revealed portions of associated epitaxy prior to forming the contact.

8. The semiconductor device fabrication process of claim 6, further comprising:
   forming a liner within the contact trench contacting the revealed portions of associated epitaxy prior to forming the contact.

9. The semiconductor device fabrication process of claim 7, wherein salicide layers associated with the first gate stack pair merge.

10. A semiconductor device comprising:
    a plurality of fins formed upon a semiconductor substrate, the plurality of fins each comprising fin portions;
    a plurality of gate stacks formed upon the semiconductor substrate and upon and orthogonal to the plurality of fins;
    a first semiconductor substrate recess between a first gate stack pair and a second semiconductor recess between a second gate stack pair, and;
    unmerged epitaxy comprising a first epitaxy pair contacting fin portions associated with the first gate stack pair and a second epitaxy pair contacting fin portions associated with the second gate stack pair.

11. The semiconductor device of claim 10, wherein the first gate stack pair is separated by a first pitch and the second gate stack pair is separated by a second pitch greater than the first pitch.

12. The semiconductor device of claim 10, wherein sidewalls of the fin portions are coplanar with sidewalls of the plurality of gate stacks.

13. The semiconductor device of claim 10, further comprising:
    a dielectric layer upon the semiconductor substrate within the first semiconductor substrate recess and within the first semiconductor substrate recess, the dielectric layer contacting the first epitaxy pair and the second epitaxy pair and surrounding the first gate stack pair and the second gate stack pair.

14. The semiconductor device of claim 13, further comprising:
    a first contact trench within the dielectric layer between the first gate stack pair, the first epitaxy pair revealed within the first contact trench, and;
    a second contact trench within the dielectric layer between the second gate stack pair, the second epitaxy pair revealed within the second contact trench.

15. The semiconductor device of claim 14, further comprising:
    a first contact within the first contact trench and a second contact within the second contact trench.

16. The semiconductor device of claim 15, further comprising:
    a salicide layer upon the revealed first epitaxy pair and upon the revealed second epitaxy pair.

17. The semiconductor device of claim 15, further comprising:
    a first liner within the first contact trench contacting the revealed first epitaxy pair, and;
    a second liner within the second contact trench contacting the revealed second epitaxy pair.

18. The semiconductor device of claim 16, wherein the salicide layer upon the revealed first epitaxy pair is a merged salicide layer.

* * * * *